United States Patent
Kim et al.

(10) Patent No.: US 10,014,825 B2
(45) Date of Patent: Jul. 3, 2018

(54) RECEIVER

(71) Applicant: SAMSUNG ELECTRONICS CO., LTD., Suwon-si (KR)

(72) Inventors: Seong Joong Kim, Hwaseong-si (KR); Sang Joon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/657,733

(22) Filed: Jul. 24, 2017

(65) Prior Publication Data

US 2018/0145632 A1 May 24, 2018

(30) Foreign Application Priority Data

Nov. 21, 2016 (KR) ........................ 10-2016-0154745

(51) Int. Cl.
*H04L 27/00* (2006.01)
*H03D 11/08* (2006.01)
*H03F 3/19* (2006.01)
*H03G 3/30* (2006.01)

(52) U.S. Cl.
CPC ............. *H03D 11/08* (2013.01); *H03F 3/19* (2013.01); *H03G 3/3036* (2013.01); *H03F 2200/102* (2013.01); *H03F 2200/294* (2013.01); *H03F 2200/451* (2013.01)

(58) Field of Classification Search
CPC ....... H03F 2200/102; H03F 2201/3227; H03F 2200/435
USPC .................................. 375/316, 340, 324, 343
See application file for complete search history.

(56) References Cited

U.S. PATENT DOCUMENTS

| | | | |
|---|---|---|---|
| 6,160,449 A * | 12/2000 | Klomsdorf | H03F 1/0205 330/149 |
| 6,937,847 B2 * | 8/2005 | Ehrenreich | H03G 3/3036 324/110 |
| 7,212,747 B2 | 5/2007 | Niiho | |
| 7,288,987 B2 | 10/2007 | Carichner et al. | |
| 8,270,536 B2 | 9/2012 | Reiche | |
| 9,014,238 B2 | 4/2015 | Jantunen et al. | |
| 9,014,310 B2 | 4/2015 | Park et al. | |
| 9,054,937 B2 * | 6/2015 | Midya | H04L 27/3809 |
| 9,184,959 B2 * | 11/2015 | Bynam | H04L 27/06 |

(Continued)

FOREIGN PATENT DOCUMENTS

CN 104467887 A 3/2015
JP 2001-56349 A 2/2001

(Continued)

OTHER PUBLICATIONS

Vidojkovic, Maja, et al. "A 2.4 GHz ULP OOK Single-Chip Transceiver for Healthcare Applications." *IEEE Transactions on Biomedical Circuits and Systems* 5.6 (2011). (3 pages, in English).

*Primary Examiner* — Sonny Trinh
(74) *Attorney, Agent, or Firm* — NSIP Law

(57) ABSTRACT

Provided is a receiver including an oscillator (OSC) configured to generate an oscillation signal based on a radio signal, a clocked envelope detector (ED) configured to detect an envelope of the oscillation signal and hold a peak value of the envelope during a time interval, and an analog-to-digital converter (ADC) configured to convert the peak value of the envelope into a digital signal.

22 Claims, 7 Drawing Sheets

(56) References Cited

U.S. PATENT DOCUMENTS

| | | | |
|---|---|---|---|
| 9,257,941 B2* | 2/2016 | Fagg | H03F 1/0266 |
| 2006/0270381 A1 | 11/2006 | Park et al. | |
| 2015/0207530 A1 | 7/2015 | Kim et al. | |
| 2016/0134250 A1 | 5/2016 | Imai et al. | |
| 2017/0201281 A1 | 7/2017 | Kim et al. | |

FOREIGN PATENT DOCUMENTS

| | | |
|---|---|---|
| JP | 2012-134615 A | 7/2012 |
| JP | 5471694 B2 | 4/2014 |
| JP | 5656617 B2 | 12/2014 |
| KR | 10-0615745 B1 | 8/2006 |
| KR | 10-2011-0116898 A | 10/2011 |
| KR | 10-1529635 B1 | 6/2015 |
| KR | 10-1574703 B1 | 12/2015 |
| WO | WO 2005/104400 A1 | 11/2005 |
| WO | WO 2007/066528 A1 | 6/2007 |
| WO | WO 2014/017114 A1 | 1/2014 |

* cited by examiner

FIG. 7
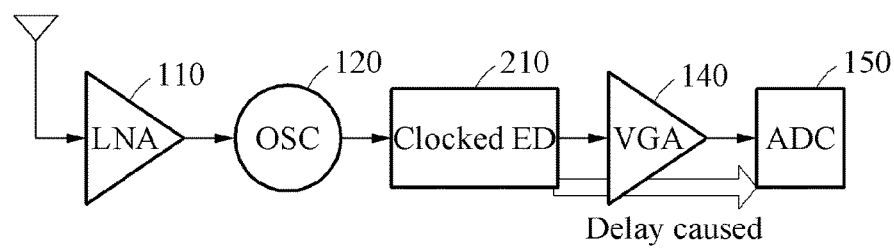
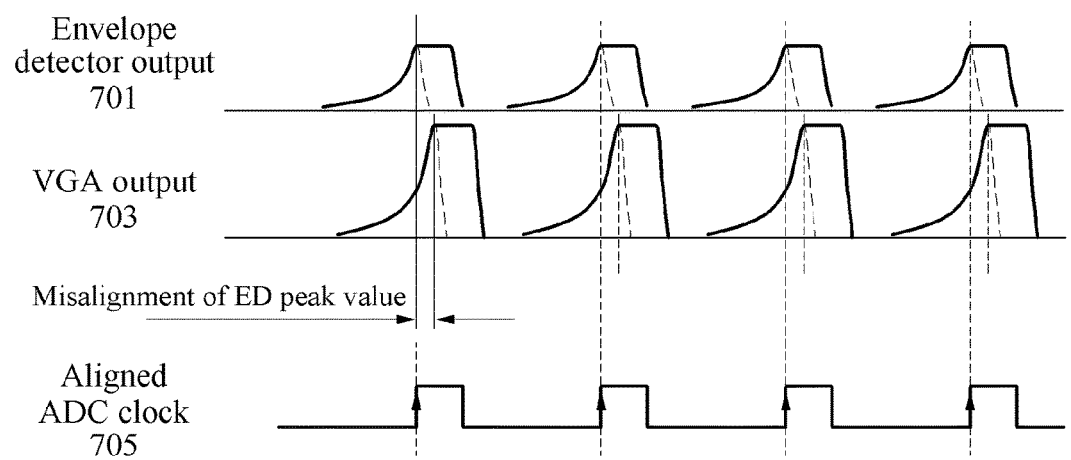

RECEIVER

CROSS-REFERENCE TO RELATED APPLICATION(S)

This application claims the benefit under 35 USC § 119(a) of Korean Patent Application No. 10-2016-0154745 filed on Nov. 21, 2016, in the Korean Intellectual Property Office, the entire disclosure of which is incorporated herein by reference for all purposes.

BACKGROUND

1. Field

The following description relates to a receiver, and more particularly, to a super-regenerative receiver (SRR) including a super-regenerative oscillator (SRO).

2. Description of Related Art

A super-regenerative receiver (SRR) including a super-regenerative oscillator (SRO) is known as a receiver that has reasonable radio sensitivity and may be easily implemented at low cost. The SRR may be widely applied to devices or systems related to various fields such as remote control toys, information systems, and surveillance devices.

For example, an envelope detected for demodulating a modulated signal received by the SRR may have a sharp peak value based on the form of oscillation of the SRO. An accurate sampling timing is desired to accurately detect the sharp peak value by an analog-to-digital converter (ADC).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a receiver includes an oscillator (OSC) configured to generate an oscillation signal based on a radio signal, a clocked envelope detector (ED) configured to detect an envelope of the oscillation signal and hold a peak value of the envelope during a preset time interval, and an analog-to-digital converter (ADC) configured to convert the peak value of the envelope into a digital signal.

The clocked ED may be configured to hold the peak value of the envelope during an interval of a symbol period of the oscillation signal based on a clock signal to detect the peak value of the envelope is detected based on a sampling timing of the ADC.

The clocked ED may be configured to create an electric charge corresponding to the envelope at an interval during which the oscillation signal is generated by the OSC, and maintain the created electric charge for an interval during which the oscillation signal is caused to disappear by the OSC.

An interval during which the oscillation signal may be generated and an interval during which the oscillation signal is caused to disappear are controlled by a clock signal.

The clocked ED, and the ADC may be synchronized by a clock source that generates a clock signal.

The clocked ED may include a switch and a resistor-capacitor (RC) charging circuit comprising a resistor and a capacitor. The switch may be disposed between the resistor and the capacitor and connected in series to an input node of the clocked ED connected to an output node of the OSC and an output node of the clocked ED. The resistor may be connected between the input node and a ground node of the clocked ED, and the capacitor may be connected between the output node and the ground node of the clocked ED.

The clocked ED may include a first type of detector and a second type of detector that are different and symmetrical, and the clocked ED may be configured to output a differential signal between the first type of detector and the second type of detector.

A delay element may be configured to adjust a sampling timing of the ADC.

A clock control circuit may include a logic element configured to perform an OR operation between an input value transmitted through a switch control signal terminal of the clocked ED and a first clock signal value generated by a clock source.

The OSC may include a super-regenerative oscillator (SRO).

The receiver may further include any one or any combination of: a low noise amplifier (LNA) configured to amplify the signal-to-noise ratio of the radio signal to the OSC; and a variable gain amplifier (VGA) configured to adjust a gain to be appropriate for an input range of the ADC with respect to the envelope detected by the clocked ED.

The clock signal may be synchronized with a clock signal of the ADC.

A first clock signal generated based on the clock source may be applied to each of the OSC and the clocked ED, and a second clock signal generated based on the clock source may be applied to the ADC and a phase of the second clock signal may differ from a phase of the first clock signal.

A switching operation and a switching time of the switch may be controlled based on a clock signal.

The switch may be closed during a 75% interval of a symbol period of the oscillation signal and open during a 25% interval of the symbol period based on a clock signal to maintain the peak value of the envelope by the capacitor.

The switch may include a first switch and a second switch, and the first switch and the second switch may be connected in series between the resistor and the capacitor.

The capacitor may be a variable capacitor.

The first type of detector may include a p-metal-oxide-semiconductor field-effect transistor (p-MOSFET) type of transistor, and the second type of detector may include an n-MOSFET type of transistor.

The delay element may be configured to adjust the sampling timing of the ADC to enable the ADC to perform sampling at an interval during which the peak value is held.

In another general aspect, a receiver includes an oscillator (OSC) configured to generate an oscillation signal based on a radio signal; a clocked envelope detector (ED) configured to detect an envelope of the oscillation signal and hold a peak value of the envelope during a preset time interval based on a first clock signal; and an analog-to-digital converter (ADC) configured to convert the peak value of the envelope into a digital signal based on a second clock signal, wherein the first clock signal and the second clock signal are synchronized.

The clocked ED may include a first type of detector and a second type of detector that are different and symmetrical, and the clocked ED may be configured to output a differential signal between the first type of detector and the second type of detector.

The receiver may further include a delay element configured to adjust a sampling timing of the ADC.

Other features and aspects will be apparent from the following detailed description, the drawings, and the claims.

BRIEF DESCRIPTION OF THE DRAWINGS

FIG. 7 illustrates an example in which an output of a variable gain amplifier (VGA) is misaligned with an output of a clocked envelope detector (ED) due to a delay occurring in the VGA.

Figure 1:
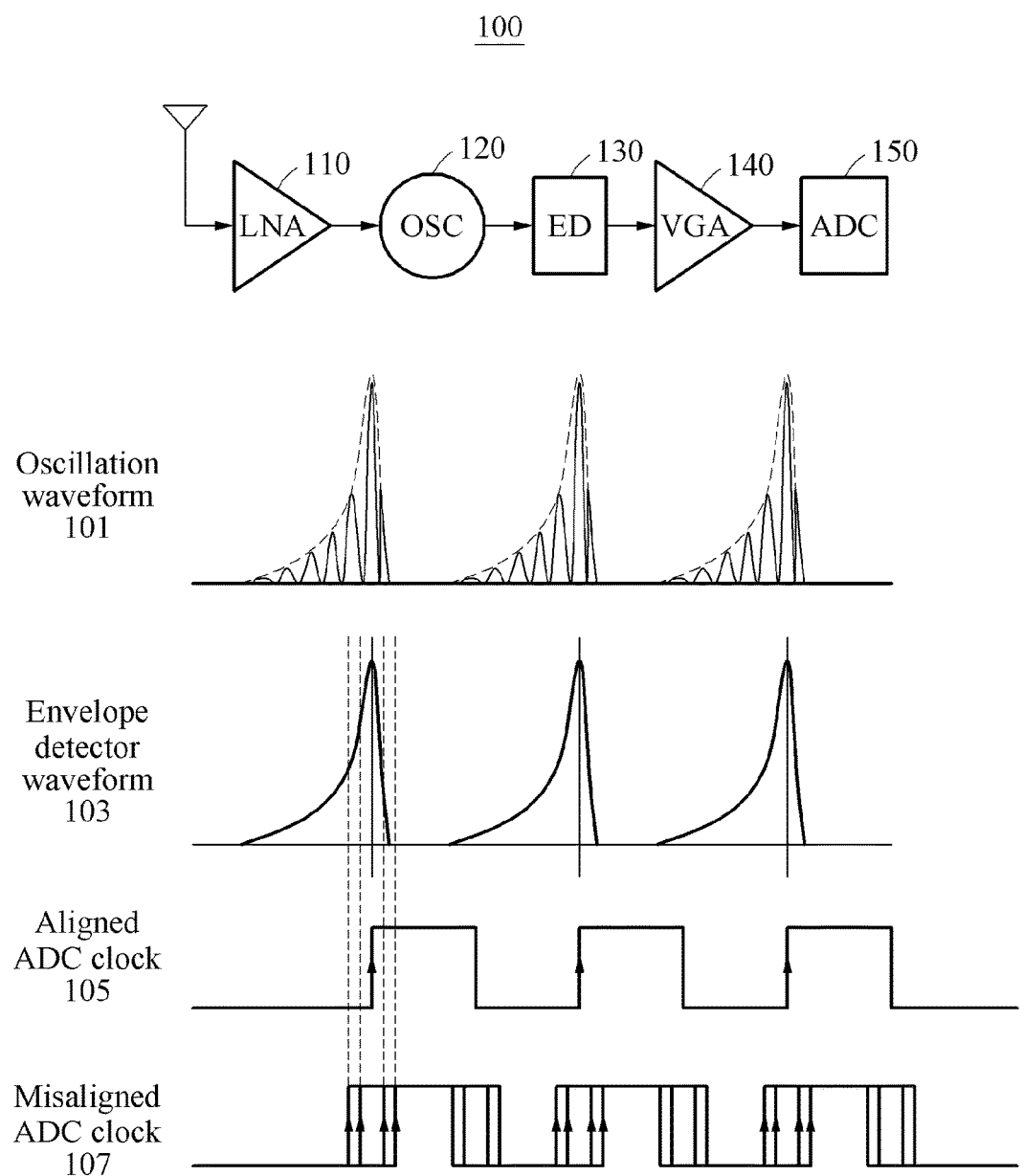
FIG. 1 illustrates an example of a relationship between an envelope detected by a receiver and a sampling clock of an analog-to-digital converter (ADC).

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings, and like reference numerals refer to like elements throughout. In the following description, examples are set out which may be used to minimize a calculation complexity for detecting a peak value of an envelope detector (ED) in a field such as an energy transmission field or a data transmission field in a voice processing field, an image processing field, or a data communication field.

A receiver including a clocked ED may be used to exchange control information and other information between a transmitter and a receiver in a wireless power transmission system in which a mobile phone or a wireless television (TV) is used. In addition, the receiver including the clocked ED may be applied to a bio health care field and may be used to remotely transmit power to a device inserted into a human body or to wirelessly transmit power to a band type of device to measure a heart rate.

FIG. 1 illustrates an example of a relationship between an envelope detected by a receiver and a sampling clock of an analog-to-digital converter (ADC). FIG. 1 illustrates an example in which a peak value of an envelope detected by a receiver 100 is aligned with a sampling clock of an ADC and an example in which the peak value of the envelope detected by the receiver 100 is misaligned with the sampling clock of the ADC.

Before the relationship between the envelope and the sampling clock is described, a structure and an operation of the receiver 100 is described below.

The receiver 100 includes a low noise amplifier (LNA) 110, an oscillator (OSC) 120, an envelope detector (ED) 130, a variable gain amplifier (VGA) 140, and an analog-to-digital converter (ADC) 150.

The receiver 100 receives a radio signal of a radio frequency (RF) band through an antenna. The radio signal may correspond to a carrier wave signal modulated by a transmitter.

The radio signal is amplified by the LNA 110 while minimizing signal-to-noise ration degradation. The OSC 120 produces periodic wave signals at an oscillation frequency to receive the radio signal amplified through the LNA 110. In an example, the OSC 120 generates an oscillation signal having an oscillation frequency based on the radio signal. The OSC 120 may control oscillation based on a signal transmitted from the LNA 110.

The OSC 120 generates, for example, an oscillation signal having an oscillation waveform 101. The oscillation signal output by the OSC 120 is demodulated through the ED 130. The ED 130 detects an envelope of the oscillation signal output by the OSC 120. The ED 130 detects, for example, an envelope having a waveform 103. A form of the envelope of the radio signal that passes through the ED 130 may be transmitted to a baseband.

The VGA 140 adjusts the gain of the signal detected by the ED 130 to be appropriate for an input range of the ADC 150.

The ADC 150 converts an output signal (analog signal) of the VGA 140 into a digital signal. For example, a clock signal 105 that is aligned without a shake or a jitter is applied to the ADC 150, or a clock signal 107 that is misaligned due to jitter is applied to the ADC 150. The clock signal 105 may be a sampling clock signal aligned with the peak value of the envelope, and the clock signal 107 may be a sampling clock signal misaligned with the peak value of the envelope.

In an example in which the ADC 150 converts a sampled value into a digital signal at a rising edge of a clock signal. In response to the clock signal 105 being applied to the ADC 150, the ADC 150 detects values of the waveform 103 corresponding to the rising edge of the clock signal 105. Due to the clock signal 105 being aligned with the peak value of the envelope, the ADC 150 samples the peak value of the waveform 103 corresponding to the rising edge of the clock signal 105. The ADC 150 then converts the peak value of the waveform 103 into a corresponding digital signal.

In response to the clock signal 107 being applied to the ADC 150, the ADC 150 samples the value of the waveform 103 corresponding to the rising edge of the clock signal 107. Due to the clock signal 107 being misaligned with the peak value of the envelope, the ADC 150 samples the value of the waveform 103 corresponding to the rising edge of the clock signal 107 as an invalid value, for example, a pre-peak value or a post-peak value, other than the peak value of the waveform 103. The misalignment results in the ADC 150 converting a value less than the peak value of the waveform 103 into the corresponding digital signal.

Thus, the value of the digital signal output by the ADC 150 may be different depending on whether the sampling clock of the ADC 150 is aligned or misaligned with the peak value of the detected envelope.

Figure 2:
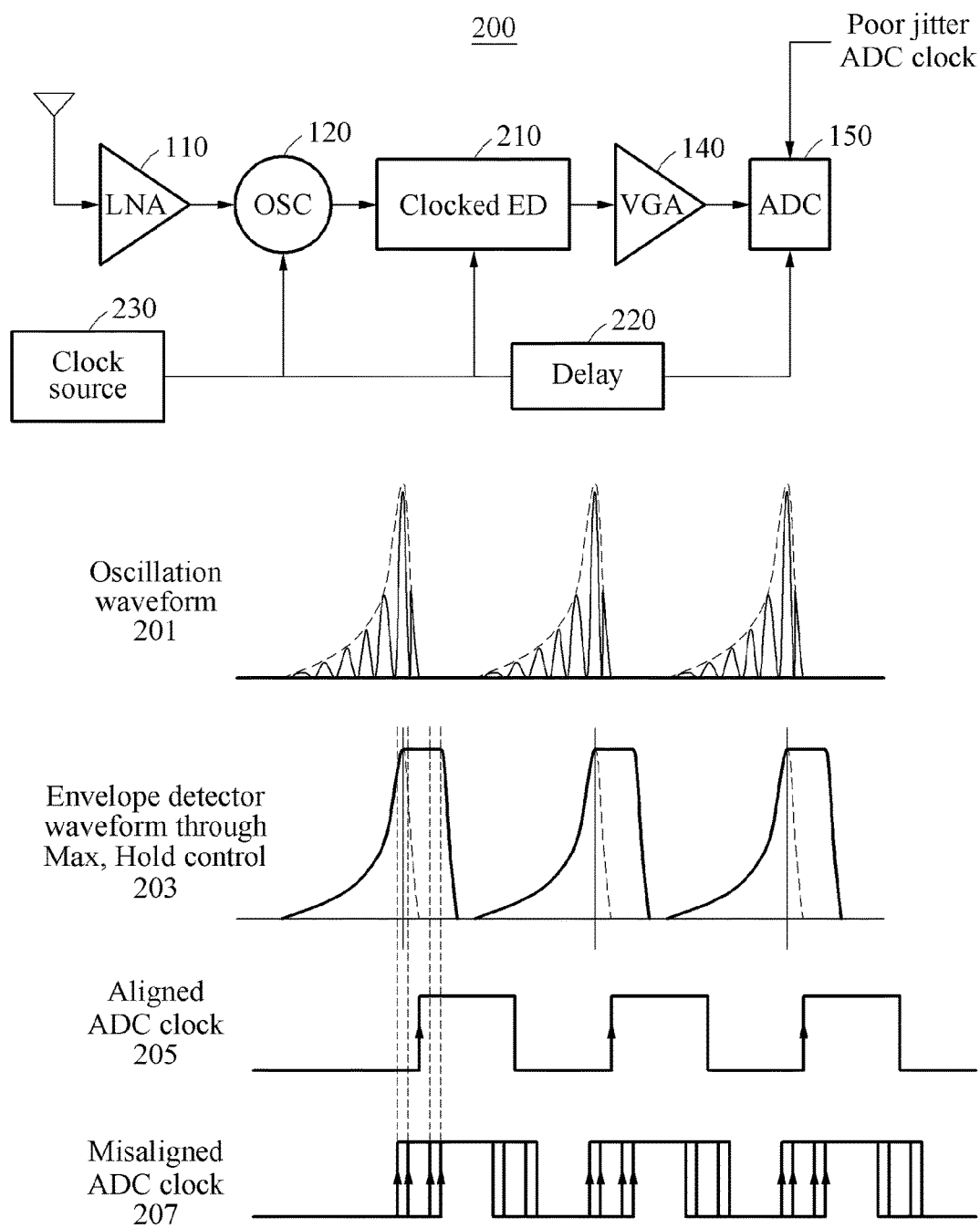
FIG. 2 illustrates an example of an operation and a configuration of a receiver.

FIG. 2 illustrates an example of an operation and a configuration of a receiver. FIG. 2 illustrates a structure of a receiver 200. The receiver 200 includes the LNA 110, the OSC 120, a clocked ED 210, the VGA 140, the ADC 150, and a clock source 230.

Hereinafter, differences in operations of the LNA 110, the OSC 120, the VGA 140, and the ADC 150 of FIG. 1 are described.

The clocked ED 210 detects an envelope of an oscillation signal generated by the OSC 120 and holds a peak value of the envelope during a preset time interval. The clocked ED 210 is an ED configured to hold a peak value of an envelope based on a clock signal.

The clocked ED 210 holds the peak value, for example, a maximum peak value, of the envelope during a predetermined interval of a symbol period of the oscillation signal based on the clock signal generated by the clock source 230. As a result, the peak value of the envelope is sampled based on a sampling timing of the ADC 150. The peak value of the envelope held by the clocked ED 210 may have a form identical to a waveform 203.

An example of the operation principle and implementation circuit of the clocked ED 210 to hold the peak value of the envelope based on the clock signal will be described with reference to FIGS. 3 through 5.

Generation and disappearance of the oscillation signal of the OSC 120 is controlled by the clock signal, and the clock signal is synchronized with a clock signal of the ADC 150. Alternatively, the OSC 120, the clocked ED 210, and the ADC 150 of the receiver 200 may be synchronized by a clock signal generated by the clock source 230.

The OSC 120 oscillates using a radio signal received through an antenna. The OSC 120 that oscillates in response to a signal received from an outside is referred to as a super regenerative oscillator (SRO). The receiver 200 obtains a gain through the SRO with respect to the radio signal. The receiver 200 obtains an envelope of the radio signal amplified through the SRO using the clocked ED 210 such that a range of a frequency band of the radio signal decreases to a baseband.

A quench signal is applied such that a channel filtering effect is exhibited with respect to a predetermined frequency when current is supplied to the OSC 120.

The OSC 120 oscillates in response to the received external signal based on an injection current including a quench waveform. The injection current is injected by an additional current source or a current generator (not shown). The current source enables the OSC 120 to oscillate by injecting a sufficient amount of current to the OSC 120.

In response to the current source injecting a threshold current to the OSC 120, the OSC 120 begins to oscillate in response to a signal received through the antenna, that is, a signal received from the LNA 110. Also, the current source supplies the OSC 120 with the injection current having the quench waveform, that is, the quench signal.

The quench signal is generated by an extra quench signal generator such that channel filtering effect is exhibited with respect to the predetermined frequency when current is supplied to the OSC 120 to stabilize performance of the OSC 120. For example, the quench waveform has a form similar to an exponential curve, but the form of the quench waveform is not limited thereto. The quench waveform may have other forms. An average value of the quench waveform may be a threshold current amount used for oscillating the OSC 120.

The oscillation of the SRO is cyclically stopped by the quench signal. For example, a frequency of the quench signal may be set to be two times greater than or equal to an analog data frequency or a data transmission rate based on a Nyquist rate at which analog data is sampled to digital data without an influence of intersymbol interferences. For example, in response to a data transmission rate being set to be 50 kilobytes per second (kbps) and a frequency of a quench signal being set to be 200 kbps which is four times the data transmission rate, the quench signal may be sampled to four signals when a signal is "ON" because the frequency of the quench signal is sampled four times more than an input data signal.

In response to the quench signal being applied to the OSC 120, the OSC 120 amplifies an input signal in response to a desired radio frequency (RF) signal among signals from which interference signals are filtered by the LNA 110. For example, the OSC 120 generates an oscillation signal having an oscillation waveform 201.

Referring to graphs of FIG. 2, a sampling clock of a clock signal 205 of the ADC 150 increases after a predetermined amount of time at which point a maximum peak value of a waveform 203 appears. The graphs of FIG. 2 show that a delay 220 is caused based on a circuit configuration and/or signal transmission performed between constituent elements even when the OSC 120, the clocked ED 210, and the ADC 150 of the receiver 200 are synchronized by the clock signal generated by the clock source 230.

The clocked ED 210 receiving the oscillation signal having the oscillation waveform 201 detects an envelope of the oscillation signal and output a detection result, for example, the waveform 203, by holding the maximum peak value of the envelope during a preset time interval. In an example, the maximum peak value of the envelope is sampled in a clock signal 207 misaligned with the peak value of the envelope, in addition to the clock signal 205 of which the sampling timing of the ADC 150 is aligned with the maximum peak value of the envelope in response to the clocked ED 210 holding the maximum peak value of the envelope.

The clocked ED 210 holds the maximum peak value of the envelope such that the number of times an extra tuning logic is used for adjusting a sampling timing is minimized and the calculation complexity for detecting the peak value of the envelope is minimized. In addition, the clocked ED 210 may minimize sensitivity degradation caused due to misalignment of the sampling time caused by temperature variations and aging.

In addition, the receiver 200 uses a clock having a relatively low jitter quality as a sampling clock of the ADC 150 such that the number of times an additional external element, for example, a temperature compensated oscillator (TOXO), is used, is decreased.

Figure 3:
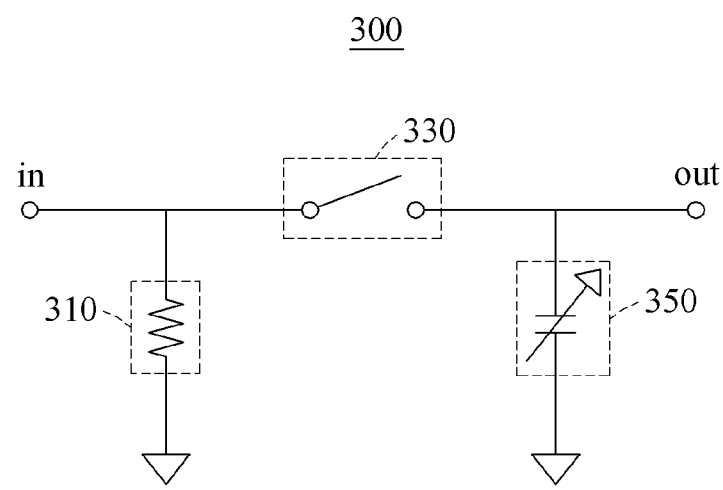
FIG. 3 illustrates an example of an operation principle of a clocked envelope detector (ED).

FIG. 3 illustrates an example of an operation principle of a clocked envelope detector (ED). FIG. 3 illustrates a simplified circuit of a clocked ED 300.

The clocked ED 300 includes a switch 330 and a resistor-capacitor (RC) charging circuit including a resistor 310 and a variable capacitor 350. The switch 330 is disposed between the resistor 310 and the variable capacitor 350, and connected in series to an input (in) node and an output (out) node of the clocked ED 300. The input node of the clocked ED 300 is connected to an output node of an oscillator (OSC).

The resistor 310 is connected between an input node and a ground node Vdd of the clocked ED 300. The variable capacitor 350 is connected between the output node and a ground node of the clocked ED 300. In one example, the variable capacitor 350 variable capacitor 350 is a capacitor bank including a plurality of capacitors.

The variable capacitor 350 enables the clocked ED 300 to be finely controlled by adjusting a charging amount, a charging rate, and a discharging rate of the variable capacitor 350.

A switching operation and a switching time of the switch 330 are controlled based on a clock signal. As an example of an operation of the switch 330, the switch 330 is closed during a 75% interval of a symbol period of the oscillation signal and is open during a 25% interval of the symbol period based on the clock signal such that the peak value of the envelope is maintained by the variable capacitor 350. In this example, closing of the switch 330 corresponds to a switch ON or a switch "close", and opening of the switch 330 corresponds to a switch OFF and a switch "open".

The clocked ED 300 charges an electric charge corresponding to an envelope to the RC charging circuit at an interval during which the oscillation signal is generated by the OSC. For example, the interval during which the oscillation signal is generated is the 75% interval of the symbol period of the oscillation signal. The oscillation signal of the 75% interval of the symbol period has a value corresponding to 1 or 0 based on a signal value input by a receiver antenna.

The clocked ED 300 maintains the charged electric charge in the variable capacitor 350 at an interval during which the oscillation signal is caused to disappear by the OSC. For example, the interval during which the oscillation signal disappears is the 25% interval of the symbol period of the oscillation signal. The 25% interval of the symbol period of the oscillation signal corresponds to a boundary time for distinguishing an oscillation signal for a current symbol from an oscillation signal for a next symbol. That is, the oscillation signal for the current symbol may completely disappear before a next symbol period starts regardless of whether an oscillation during the previous 75% interval of the symbol period is an oscillation for a symbol "1" or an oscillation for a symbol "0".

The interval during which the oscillation signal is generated and the interval during which the oscillation signal disappears are controlled by the clock signal.

Figure 4:
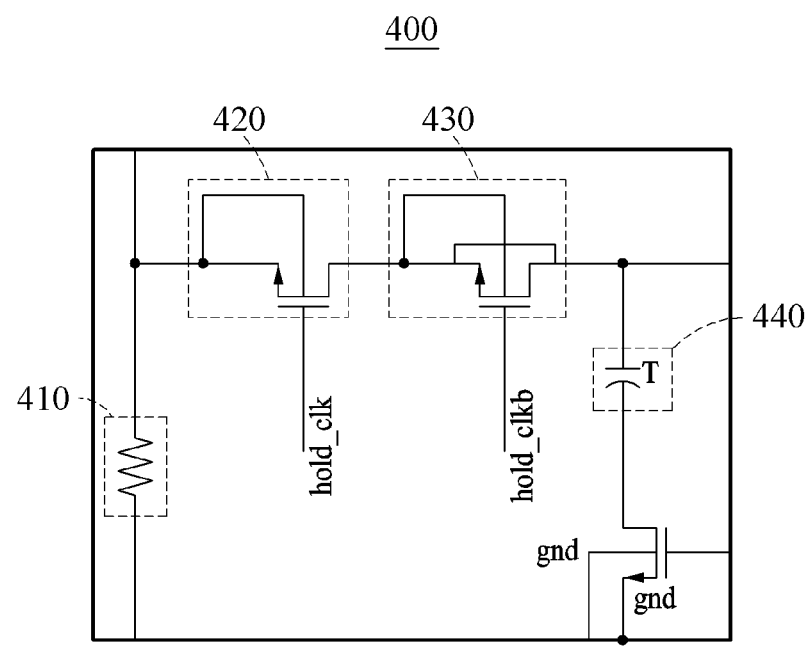
FIG. 4 illustrates an example of a configuration of a circuit of a clocked envelope detector (ED).

FIG. 4 illustrates an example of a configuration of a circuit of a clocked envelope detector (ED). FIG. 4 illustrates a circuit configuration when a clocked ED 400 includes two switches. The clocked ED 400 includes a resistor 410, a first switch 420, a second switch 430, and a capacitor 440.

The first switch 420 and the second switch 430 are connected in series between the resistor 410 and the capacitor 440. Each of the first switch 420 and the second switch 430 includes an n-metal-oxide-semiconductor field-effect transistor (n-MOSFET) type of transistor. A clock signal hold_clk is applied to the first switch 420 and a clock signal hold_clkb obtained by the clock signal hold_clk being inverted is applied to the second switch 430. For example, a clock signal of "10" is applied to the first switch 420 and a clock signal of "01" obtained by a phase inversion and a clock signal applied to the first switch 420 being inverted may be applied to the second switch 430. In an example, a clock signal of which a phase is inverted may be applied to each switch to minimize a carrier feedthrough phenomenon.

Because descriptions of operations other than an operation of inputting a clock signal of which a phase is inverted to each of the first switch 420 and the second switch 430 are applicable to descriptions of each operation of the resistor 310, the switch 330, and the variable capacitor 350, duplicated descriptions will be omitted for conciseness.

Figure 5:
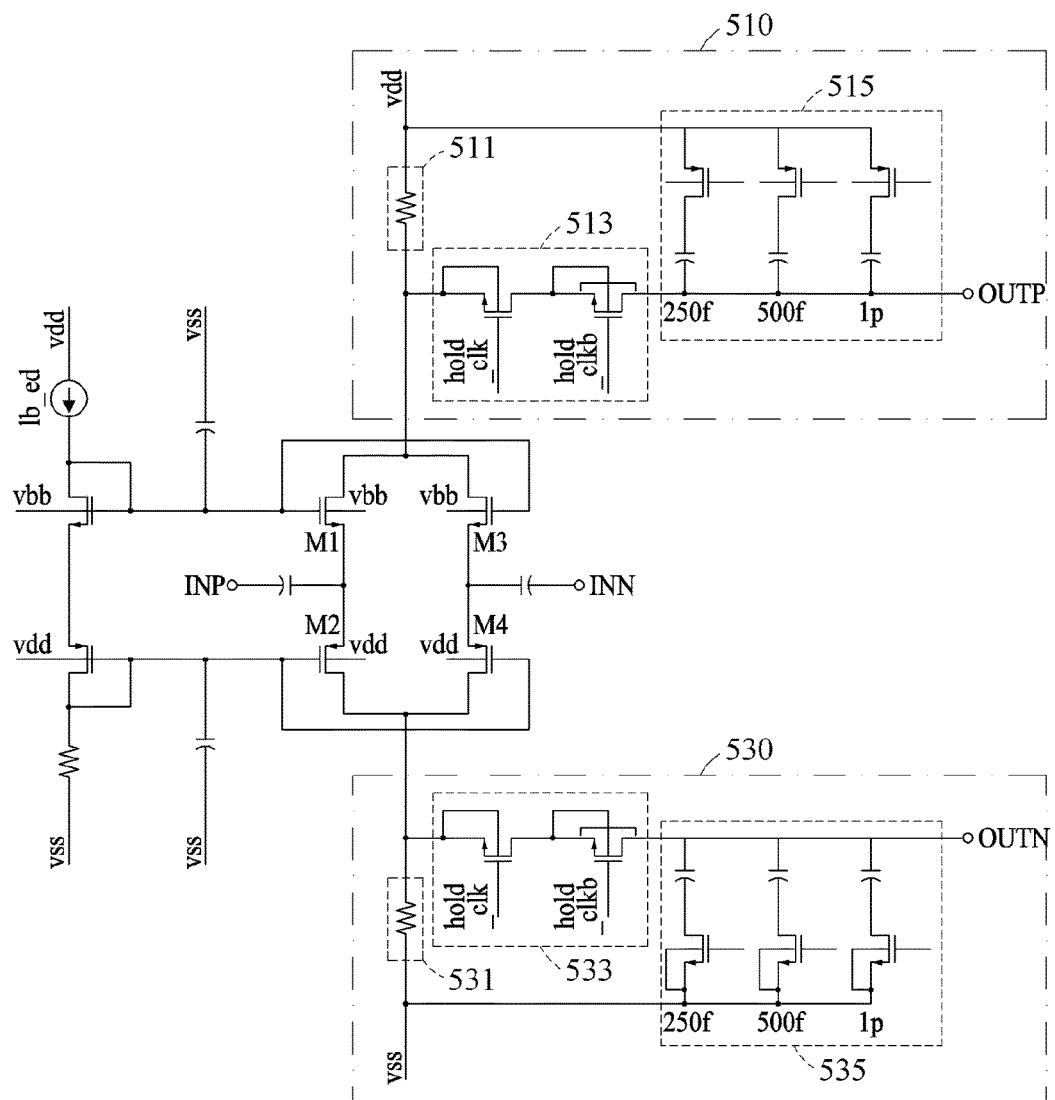
FIG. 5 illustrates another example a configuration of a circuit of a clocked envelope detector (ED).

FIG. 5 illustrates another example a configuration of a circuit of a clocked envelope detector (ED). FIG. 5 illustrates a circuit of a clocked ED 500.

The clocked ED 500 includes a first type of detector 510 and a second type of detector 530 that are different and symmetrical.

The first type of detector 510 includes a resistor 511, two switches 513 including a p-type metal-oxide-semiconductor (PMOS), and three variable capacitors 515. Each of the variable capacitors 515 accumulates charge capacitances corresponding to 250f, 500f, and 1p. As a size of a variable capacitor increases, the charging rate and the discharging rate decreases (become slower). As the size of the variable capacitor decreases, the charging rate and the discharging rate increases (become faster).

The second type of detector 530 includes two switches 533 including an n-type metal-oxide-semiconductor (NMOS) and three variable capacitors 535.

Since descriptions of the resistor, the switch, and the capacitor described with reference to FIGS. 3 and 4 are applicable to descriptions of the resistors 511 and 531, the switches 513 and 533, and variable capacitors 515 and 535, duplicated descriptions will be omitted for conciseness.

The clocked ED 500 outputs a differential signal between the first type of detector 510 and the second type of detector 530. For example, the first type of detector 510 includes a p-metal-oxide-semiconductor field-effect transistor (p-MOSFET) type of transistor, and the second type of detector 530 includes an n-MOSFET type of transistor.

A signal input through an input terminal INP is applied to each of the first type of detector 510 and the second type of detector 530 via transistors M1 and M2. In an example, a current source is connected above a diode connection MOS connected to the transistor M1.

In addition, a signal input through an input terminal INN is applied to each of the first type of detector 510 and the second type of detector 530 via transistors M3 and M4. The transistors M1 and M3 are n-MOSFET type of transistors, and the transistors M2 and M4 are p-MOSFET type of transistors.

The clocked ED 500 outputs the differential signal between the first type of detector 510 and the second type of detector 530 via output terminals OUTP and OUTN.

Figure 6:
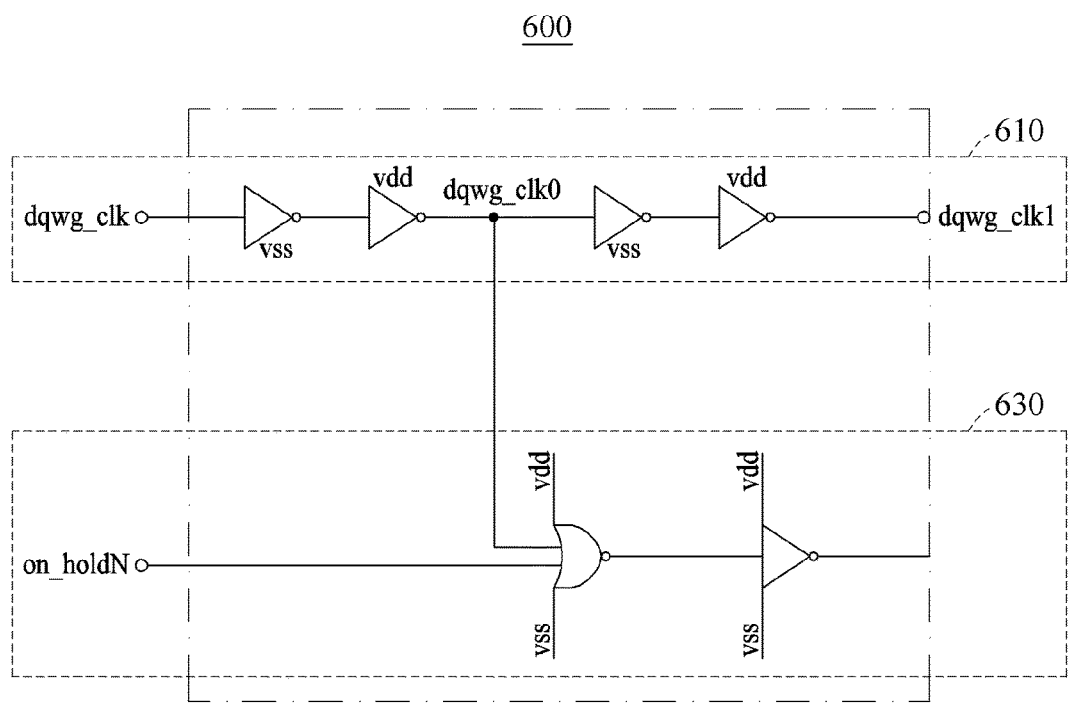
FIG. 6 illustrates an example of a configuration of a clock control circuit configured to control a clock applied to a receiver.

FIG. 6 illustrates an example of a configuration of a clock control circuit configured to control a clock applied to a receiver. Referring to FIG. 6, a clock control circuit 600 includes a clock transmit circuit 610 configured to transmit a clock signal generated by a clock source to an oscillator (OSC) and a switch control logic circuit 630 configured to transmit a switch control signal to which the clock signal is applied to an envelope.

For example, the clock transmit circuit 610 performs buffering on a dequenching clock signal dqwg_clk generated by the clock source through two inverters. A dequenching clock signal dqwg_clk0 on which the buffering is performed through two inverters is buffered again through two inverters and then a dequenching clock signal dqwg_clk1 is applied to the OSC. Here, the dequenching clock signal dqwg_clk0 is applied in response to an input of the switch control logic circuit 630.

A value of the dequenching clock signal dqwg_clk0 applied to the switch control logic circuit 630 and an input value transmitted through a switch control signal terminal on_holdN of a clocked envelope detector (ED) is input to a logic element included in the switch control logic circuit 630. The logic element may be provided as a combination of an NOR gate and an inverter as illustrated in FIG. 6 or provided as an OR gate, but the logic element is not limited thereto. A result of an OR operation performed by the logic element is applied to the clock signal of the clocked ED (more precisely, a switch of the clocked ED).

For example, in response to a signal input value transmitted through the switch control signal terminal being "1", "1" is input to the switch of the clocked ED such that the switch is closed. In response to a test input value being "1", the clocked ED operates as a general ED that does not hold a maximum peak value.

In response to the signal input value transmitted through the switch control signal terminal being "0", "0" is applied to the switch of the clocked ED such that the switch is open unless the dequenching clock signal dqwg_clk0 is not "1". While the switch is open, the clocked ED holds the maximum peak value.

FIG. 7 illustrates an example in which an output of a variable gain amplifier (VGA) is misaligned with an output of a clocked envelope detector (ED) due to a delay occurring in the VGA.

For example, a waveform 701 of which a peak value detected by the clocked ED 210 is held. The peak value detected by the clocked ED 210 is delayed and output to be, for example, a waveform 703, through the VGA 140 due to various causes, such as temperature variations in an output process, deterioration in elements that constitute components, a delay between circuit blocks, and a delay caused by layout routing. That is, an output of the VGA 140 is misaligned with an output of the clocked ED 210.

Unlike the waveform 703 output through the VGA 140 being delayed, the ADC 150 outputs a value different from a peak value that is actually detected based on the delayed waveform 703 in response to a sampling clock 705 of the ADC 150 being synchronized with the clocked ED 210.

Figure 8:
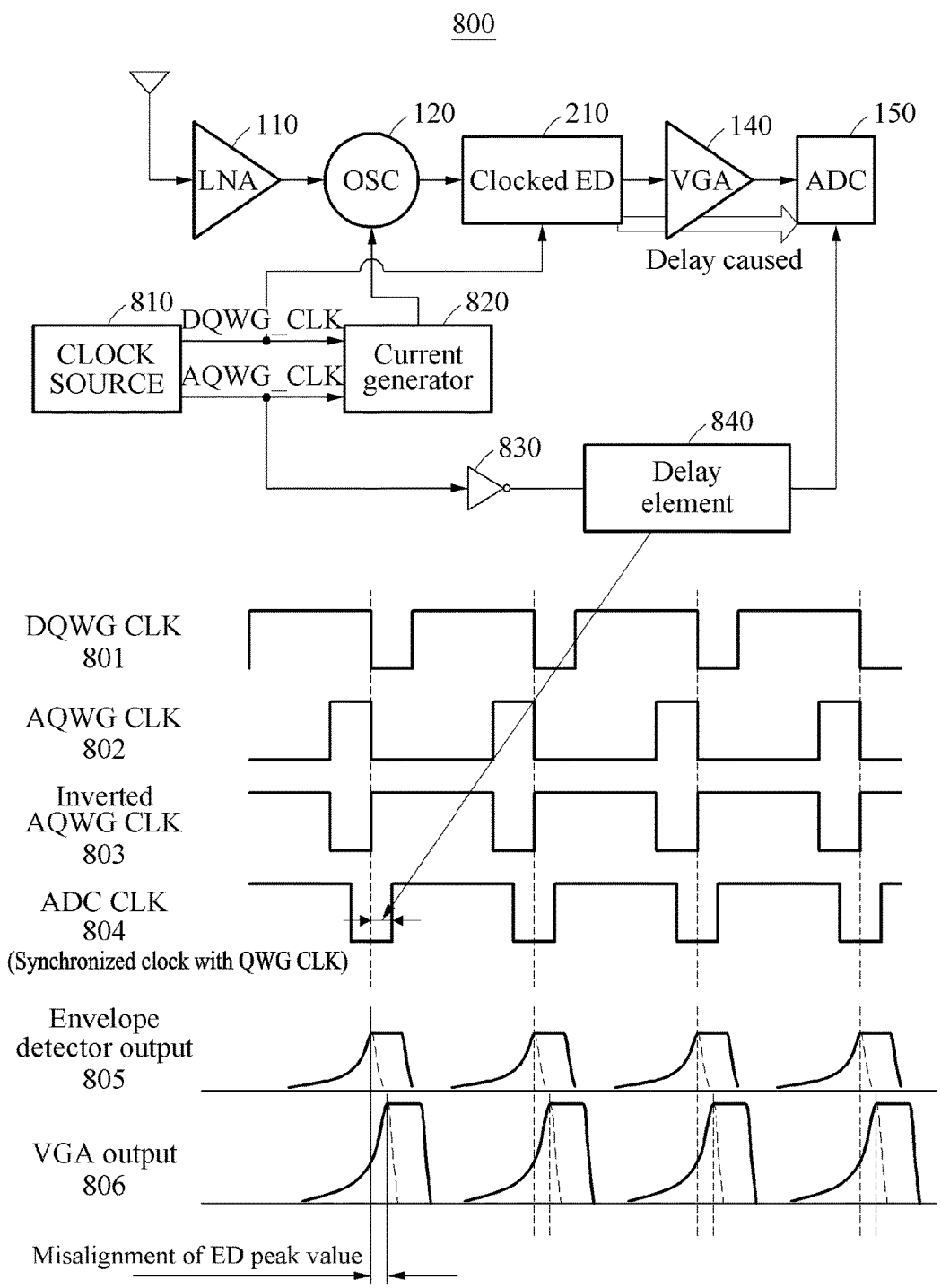
FIG. 8 illustrates another example of an operation and a configuration of a receiver.

FIG. 8 illustrates another example of an operation and a configuration of a receiver. FIG. 8 illustrates a structure and an operation of a receiver 800 to resolve a problem where a sampling reference timing of a clock of the ADC 150 is located in the middle of a peak value of the VGA 140, due to a delay of a signal.

The receiver 800 further includes a delay element 840 configured to adjust a sampling timing of the ADC 150. The delay element 840 adjusts the sampling timing of the ADC 150 such that the ADC 150 performs sampling at an interval during which a peak value of the clocked ED 210 is held, that is, for coarse tuning, even when a delay occurs between constituent elements of the receiver 800.

The receiver 800 generates a signal of a dequenching clock DQWG CLK 801 and a signal of an aquenching clock AQWG CLK 802 by dividing the clock signal generated by a clock source 810 into different phases. For example, the signal of the dequenching clock 801 may be a quenching signal generated by a digital circuit. The signal of the dequenching clock 801 is applied to the OSC 120 and the clocked ED 210. In an example, the signal of the dequenching clock 801 applied to the OSC 120 is transmitted through a current generator 820.

The signal of the aquenching clock 802 may be a quenching signal generated by an analog circuit. A phase of the signal of the aquenching clock 802 is inverted by an inverter 830, and a signal of an aquenching clock Inverted AQWG CLK 803 of which a phase is inverted is applied to the ADC 150 through the delay element 840.

The signal of the aquenching clock 803 of which the phase is inverted is delayed during a programmable delay time, while the signal of the aquenching clock 803 passes through the delay element 840, and is then applied to a clock signal 804 of the ADC 150. In an example, the programmable delay time is an amount of time used for allowing the ADC 150 to perform sampling at the interval during which the peak value of the clocked ED 210 is held.

The current generator 820 generates an injection current having a quench waveform based on the signal of the dequenching clock 801 and injects the generated injection current to the OSC 120. In response to the current generator 820 injecting a threshold current to the OSC 120, the OSC 120 starts to oscillate in response to a signal received from the LNA 110.

The clocked ED 210 detects an envelope of an oscillation signal output by the OSC 120 based on the signal of the dequenching clock 801. The clocked ED 210 creates an electric charge by tracking the envelope of the oscillation signal through a resistor-capacitor (RC) charging circuit in the clocked ED 210 while the signal of the dequenching clock 801 is "1" or "HIGH".

The clocked ED 210 maintains the charged electric charge in a capacitor while the signal of the dequenching clock 801 is "0" or "LOW". In response to the signal of the dequenching clock 801 being "1" again, the clocked ED 210 rapidly discharges the electric charge maintained while the signal of the dequenching clock 801 is "0" based on a discharge slope of the RC charging circuit. A signal 805 detected by the clocked ED 210 is delayed due to various causes described with reference to FIG. 7 in a process of transmitting the signal 805 to the VGA 140 and the ADC 150. Due to such a delay, an output signal 806 of the VGA 140 is misaligned with the peak value of the clocked ED 210.

In an example, the clock signal applied to the ADC 150 by the delay element 840, that is, the signal of the aquenching clock 803 of which the phase is inverted, is delayed by a delay time occurring when a signal is transmitted between elements, such that the ADC 150 samples the signal at an interval during which the peak value of the clocked ED 210 is held.

In addition, in response to a jitter applied to the ADC 150 being undesirable, the sampling timing of the ADC 150 may jitter back and forth. In an example, a sampling point in time of the ADC 150 is within an interval during which a peak value of the clocked ED 210 is held and, thus, even when such jitter occurs, the sensitivity of the receiver 800 will not deteriorate when the jitter deteriorates.

That is, even when a clock sampling timing of the ADC 150 is aligned with the peak value of the clocked ED 210, the sensitivity of the receiver 800 will not deteriorate due to clock jitter. However, the sampling value of the ADC 150 will not change even when the sampling point in time jitters due to clock jitter of the receiver 800.

Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A receiver, comprising:
   an oscillator (OSC) configured to generate an oscillation signal based on a radio signal;
   a clocked envelope detector (ED) configured to detect an envelope of the oscillation signal and hold a peak value of the envelope during a time interval; and
   an analog-to-digital converter (ADC) configured to convert the peak value of the envelope into a digital signal, wherein the OSC, the clocked ED, and the ADC are synchronized by a clock source that generates a clock signal.

2. The receiver of claim 1, wherein the clocked ED is configured to hold the peak value of the envelope during an interval of a symbol period of the oscillation signal based on a clock signal to detect the peak value of the envelope detected based on a sampling timing of the ADC.

3. The receiver of claim 1, wherein the clocked ED is configured to create an electric charge corresponding to the envelope at an interval during which the oscillation signal is generated by the OSC, and maintain the created electric charge at an interval during which the oscillation signal is caused to disappear by the OSC.

4. The receiver of claim 1, wherein the clocked ED comprises a switch and a resistor-capacitor (RC) charging circuit comprising a resistor and a capacitor, the switch is disposed between the resistor and the capacitor and connected in series to an input node of the clocked ED connected to an output node of the OSC and an output node of the clocked ED, the resistor is connected between the input node and a ground node of the clocked ED, and the capacitor is connected between the output node and the ground node of the clocked ED.

5. The receiver of claim 4, wherein a switching operation and a switching time of the switch are controlled based on a clock signal.

6. The receiver of claim 4, wherein the switch is closed during a 75% interval of a symbol period of the oscillation signal and open during a 25% interval of the symbol period based on a clock signal to maintain the peak value of the envelope by the capacitor.

7. The receiver of claim 4, wherein the switch comprises a first switch and a second switch, and the first switch and the second switch are connected in series between the resistor and the capacitor.

8. The receiver of claim 4, wherein the capacitor is a variable capacitor.

9. The receiver of claim 1, wherein the clocked ED comprises a first type of detector and a second type of detector that are different and symmetrical, and the clocked ED is configured to output a differential signal between the first type of detector and the second type of detector.

10. The receiver of claim 9, wherein the first type of detector comprises a p-metal-oxide-semiconductor field-effect transistor (p-MOSFET) type of transistor, and the second type of detector comprises an n-MOSFET type of transistor.

11. The receiver of claim 1, further comprising:
    a delay element configured to adjust a sampling timing of the ADC.

12. The receiver of claim 11, wherein the delay element is configured to adjust the sampling timing of the ADC to enable the ADC to perform sampling at an interval during which the peak value is held.

13. The receiver of claim 11, wherein a second clock signal generated based on a clock source and inverted by an inverter is delayed by the delay element and applied to the ADC.

14. The receiver of claim 1, further comprising:
    a clock control circuit comprising a logic element configured to perform an OR operation between an input value transmitted through a switch control signal terminal of the clocked ED and a first clock signal value generated by a clock source.

15. The receiver of claim 1, wherein the OSC comprises a super-regenerative oscillator (SRO).

16. The receiver of claim 1, further comprising any one or any combination of:
    a low noise amplifier (LNA) configured to amplify the signal-to-noise ratio of the radio signal to the OSC; and
    a variable gain amplifier (VGA) configured to adjust a gain to be appropriate for an input range of the ADC with respect to the envelope detected by the clocked ED.

17. The receiver of claim 1, wherein a first clock signal generated based on the clock source is applied to each of the OSC and the clocked ED, and a second clock signal generated based on the clock source is applied to the ADC and a phase of the second clock signal differs from a phase of the first clock signal.

18. A receiver, comprising:
   an oscillator (OSC) configured to generate an oscillation signal based on a radio signal;
   a clocked envelope detector (ED) configured to detect an envelope of the oscillation signal and hold a peak value of the envelope during a time interval; and
   an analog-to-digital converter (ADC) configured to convert the peak value of the envelope into a digital signal, wherein an interval during which the oscillation signal is generated and an interval during which the oscillation signal disappears are controlled by a clock signal.

19. The receiver of claim 18, wherein the clock signal is synchronized with a clock signal of the ADC.

20. A receiver, comprising:
   an oscillator (OSC) configured to generate an oscillation signal based on a radio signal;
   a clocked envelope detector (ED) configured to detect an envelope of the oscillation signal and hold a peak value of the envelope during a time interval based on a first clock signal; and
   an analog-to-digital converter (ADC) configured to convert the peak value of the envelope into a digital signal based on a second clock signal, wherein the first clock signal and the second clock signal are synchronized.

21. The receiver of claim 20, wherein the clocked ED comprises a first type of detector and a second type of detector that are different and symmetrical, and the clocked ED is configured to output a differential signal between the first type of detector and the second type of detector.

22. The receiver of claim 21, further comprising:
   a delay element configured to adjust a sampling timing of the ADC.

* * * * *